United States Patent [19]

Morozumi

[11] 4,112,670
[45] Sep. 12, 1978

[54] ELECTRONIC TIMEPIECE

[75] Inventor: Shinji Morozumi, Suwa, Japan

[73] Assignee: Kabushiki Kaisha Suwa Seikosha, Tokyo, Japan

[21] Appl. No.: 663,946

[22] Filed: Mar. 4, 1976

[30] Foreign Application Priority Data

Mar. 4, 1975 [JP] Japan .................................. 50-26703

[51] Int. Cl.² .............................................. G04C 3/00
[52] U.S. Cl. .................. 58/23 A; 58/23 AC; 357/43
[58] Field of Search ................. 58/23 R, 23 A, 50 R, 58/23 BA; 357/42, 43; 307/303, 304; 324/29.5; 320/39, 43; 340/249

[56] References Cited

U.S. PATENT DOCUMENTS

| | | | |
|---|---|---|---|
| 3,590,343 | 6/1971 | Nathanson | 317/235 R |
| 3,595,714 | 7/1971 | Thire et al. | 357/43 |
| 3,742,698 | 7/1973 | Naito | 58/23 A |
| 3,778,688 | 12/1973 | Granford | 357/43 |
| 3,810,355 | 5/1974 | Ito | 58/23 A |
| 3,832,629 | 8/1974 | Cerner, Jr. | 324/29.5 |
| 3,838,440 | 9/1974 | McCaffret et al. | 354/43 |
| 3,886,726 | 6/1975 | Williams et al. | 58/50 R |
| 3,905,188 | 9/1975 | Nishikubo et al. | 58/23 R |
| 3,916,222 | 10/1975 | Compton | 307/251 |
| 3,934,399 | 1/1976 | Nishimura et al. | 58/23 R |
| 3,939,642 | 2/1976 | Morozumi | 58/23 A |
| 3,950,940 | 4/1976 | Nishimura et al. | 58/23 A |
| 3,955,269 | 5/1976 | Magdo et al. | 357/43 X |

Primary Examiner—Robert K. Schaefer
Assistant Examiner—Vit W. Miska
Attorney, Agent, or Firm—Blum, Moscovitz, Friedman & Kaplan

[57] ABSTRACT

An electronic timepiece wherein the timekeeping circuitry is formed of bipolar transistors and C-MOS transistors integrated on a single integrated circuit chip substrate is provided. The electronic timepiece includes timekeeping circuitry for producing timekeeping signals and a display device for displaying time in response to the timekeeping signals. At least a portion of the timekeeping circuitry is formed of C-MOS transistors formed on an integrated circuit chip substrate, a further portion of the timekeeping circuitry being formed of bipolar transistors formed in the same integrated circuit chip substrate as the C-MOS transistors.

21 Claims, 14 Drawing Figures

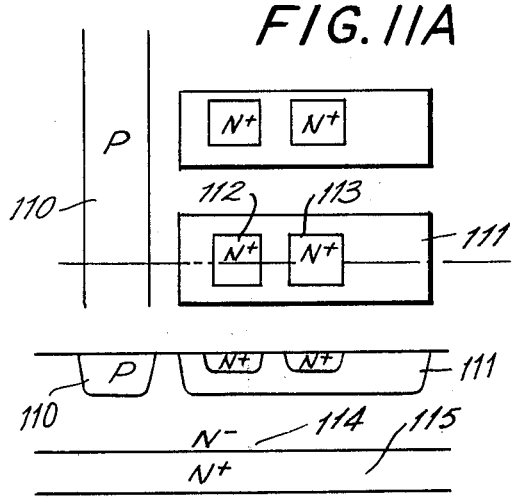
FIG. 11A
FIG. 11B
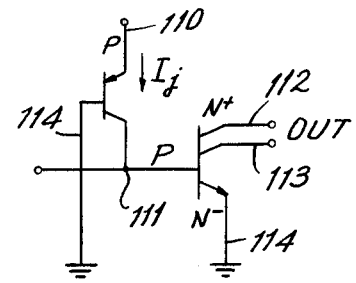
FIG. 12
FIG. 13
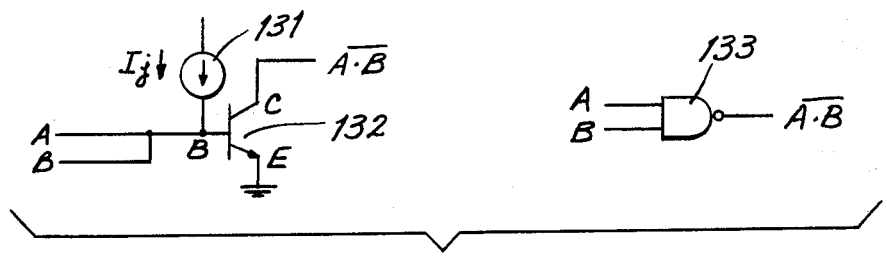

ELECTRONIC TIMEPIECE

BACKGROUND OF THE INVENTION

This invention is directed to an electronic timepiece wherein the timekeeping circuitry is formed on an integrated circuit chip, and in particular to an electronic timepiece wherein the timekeeping circuitry is formed of bipolar transistors and C-MOS transistors formed on the same integrated circuit chip substrate.

While small sized electronic timepieces such as wristwatches and the like have taken on various forms, such electronic wristwatches each include an oscillator circuit for producing a high frequency time standard signal, divider circuitry for producing low frequency timekeeping signals in response to the high frequency time standard signal, and a display for displaying time. If the display is a hands display, the divider circuit produces a low frequency timekeeping signal having a period of one second, and such signal effects a stepping of the hands display once each second. Alternatively, if a digital display, usually formed of liquid crystals or light emitting diodes is formed, the divider circuit produces timekeeping signals having distinct periods such as one second, one minute, one hour, one month, which signals are applied to appropriate driving and decoding circuitry to effect driving of the digital display elements, which display elements in turn display actual time.

In order to obtain a highly accurate timepiece, the high frequency time standard signal is produced by an oscillator circuit utilizing a quartz crystal vibrator capable of vibrating at a natural frequency of 32,768 as a time standard. Such oscillator circuits use complementary coupled MOS transistors, hereinafter referred to as "C-MOS" transistors. Additionally, such C-MOS transistors are utilized in the driving circuit for driving the display. The use of such C-MOS transistors in electronic wristwatch oscillator and driving circuits is based on the need for obtaining low voltage operation with a minimum of power consumption.

It is noted that when utilized in electronic wristwatches, C-MOS transistors require substantially no static electric power and consume an amount of power proportional to the operating frequency at which the circuitry operates, such power consumption being moderate in the range of 32 KHz. Accordingly, in view of the minimal power consumed by C-MOS transistors, same are usually suitable for use in electronic timepieces. Nevertheless, in circuits for handling currents or for performing linear operation, such C-MOS transistors are not always desirable.

For example, when MOS transistors are utilized in quartz crystal oscillator circuits, the stability of the quartz crystal oscillator circuit is less than that obtainable by utilizing bipolar transistors in the oscillator circuit in view of the wide variations in the threshold value of the MOS transistors, the generally high threshold value of such MOS transistors, and the large changes in intrinsic transconductance ($g_m$) caused by changes in the operating point. Such lack of stability when utilizing MOS transistors renders it more difficult to obtain a highly accurate timepiece. Moreover, due to the usually large output impedance of MOS transistors, and the large area that same require to absorb a considerable amount of electric current, it is necessary for a driver circuit formed of same to occupy from one-third to one-half of the entire integrated circuit chip to drive the step motor coil when a mechanical hand display is utilized.

Moreover, when light emitting diodes are utilized to form a digital display, driving currents of several 10 mA are required. In such a case, the driver circuit must be formed of bipolar transistor integrated circuitry requiring two integrated circuit chips, one for the bipolar transistors and the other for the C-MOS transistors.

SUMMARY OF THE INVENTION

Generally speaking, in accordance with the instant invention, electronic timekeeping circuitry formed of bipolar transistors and C-MOS transistors formed on the same integrated circuit chip substrate is provided. The electronic timepiece includes timekeeping circuitry for producing timekeeping signals representative of actual time and a display device for displaying actual time in response to the timekeeping signals being applied thereto. An integrated circuit chip substrate is provided, at least a portion of the timekeeping circuitry being formed of C-MOS transistors formed on the circuit chip substrate. A further portion of the timekeeping circuitry is formed of bipolar transistors formed on said integrated circuit chip substrate.

Additionally, a layer of semiconductor material is formed in the integrated circuit chip substrate, the layer of semiconductor material forming at least one electrode of one of the bipolar transistors and the layer of semiconductor material further having a diffused region therein forming at least one C-MOS transistor.

Accordingly, it is an object of this invention to provide an improved electronic timepiece including bipolar transistors and C-MOS transistors on the same integrated circuit chip substrate.

A further object of this invention is to provide improved electronic timepiece timekeeping circuitry for increasing the accuracy of the timepiece.

Still a further object of this invention is to provide an inexpensive semiconductor integrated circuit chip for use in an electronic timepiece.

Still other objects and advantages of the invention will in part be obvious and will in part be apparent from the specification.

The invention accordingly comprises the features of construction, combination of elements, and arrangement of parts which will be exemplified in the construction hereinafter set forth, and the scope of the invention will be indicated in the claims.

BRIEF DESCRIPTION OF THE DRAWINGS

For a fuller understanding of the invention, reference is had to the following description taken in connection with the accompanying drawings, in which:

FIGS. 11a and 11b are plan and sectional views respectively of a bipolar logic circuit constructed in accordance with the instant invention.

FIG. 12 is an equivalent circuit diagram of the lateral transistor depicted in FIGS. 11a and 11b; and FIG. 13 is a circuit diagram of an equivalent NAND gate circuit constructed in accordance with the instant invention.

DETAILED DESCRIPTION OF THE PREFERRED EMBODIMENTS

Figure 1:
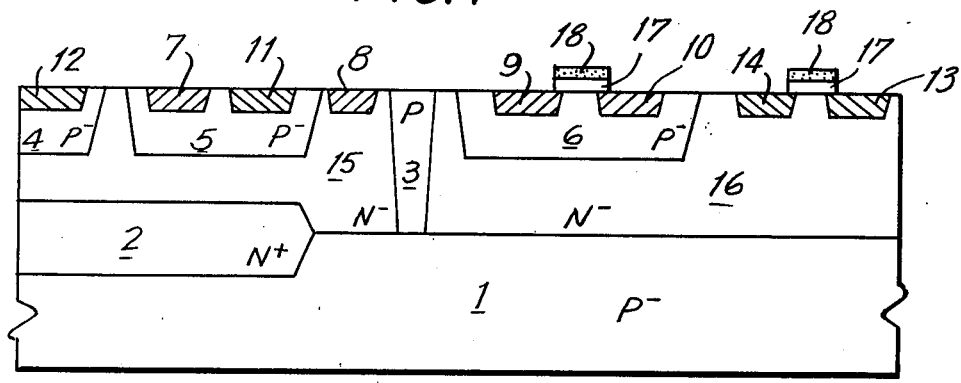
FIG. 1 is a sectional view of a C-MOS transistor and bipolar transistors disposed in the same integrated circuit chip substrate in accordance with the instant invention.

Reference is now made to FIG. 1, wherein a monolithic integrated circuit chip constructed in accordance with the instant invention is depicted. An $N^+$ embedded layer 2 is formed in a P substrate 1, whereafter, an $N^-$ epitaxial film layer is formed. As depicted in FIG. 1, the $N^-$ film layer is divided by a P diffusion layer 3 into a first $N^-$ layer 15 and a second $N^-$ layer 16. It is noted that layers 15 and 16 could also be electrically isolated by utilizing a polycrystalline silicon or alternatively an oxide film in a conventional manner. The $N^-$ layer 15 defines a bipolar transistor region and the layer 16 defines a C-MOS transistor region.

$P^-$ diffused regions 4, 5, and 6 are formed in the layers 15 and 16 at the same time. Diffused layer 4 forms the emitter of a PNP lateral type transistor and diffusion layer 5 is the collector of the PNP lateral type transistor. Additionally, diffusion layer 5 is also a base of an NPN transistor formed in layer 15. Diffusion layer 6 formed in layer 16 forms the substrate for a N-channel MOS transistor. $N^+$ diffusion layers 7 and 8 are formed in layer 15 and respectively define the collector and emitter of the NPN transistor. $N^+$ diffusion layers 9 and 10 are formed in the $P^-$ substrate 6 formed in layer 16 and define the source and drain, respectively, of the N-channel MOS transistor. It is noted that the $P^+$ diffusion layers 11 and 12 are contacts with respect to the $P^-$ layers 4 and 5, whereas the $P^+$ diffusion layers 13 and 14 define the source and drain, respectively of the P-channel MOS transistor formed in lay 16. The P-channel transistor and N-channel transistor are completed by a gate insulating films 17 and gate electrodes 18.

The P—N—P bipolar transistor is formed by the $P^-$-$N^-$-$P^-$ regions 4-15-5. The $P+$ diffusion layers 11 and 12 define the emitter-collector respectively. Also, the NPN transistor is formed of a $N^-$-$P^-$-$N+$ junction formed by diffusion layers 15-5-7 and $N^-$-diffusion layer 15 forms the emitter.

In FIG. 1, the N—P—N transistor is illustrated as a type opposite to the P—N—P transistor since same is formed so that the base 5 of the N—P—N transistor may be driven by the PNP lateral transistor. Nevertheless, when the transistors are formed so that a $N^-$ region is insulated to form only the N—P—N transistor, the $N^-$ region operates as a collector for providing a high β (gain). Accordingly, if it is necessary, the P—N—P transistor and the N—P—N transistor can be separately formed in the substrate layers and properly isolated with respect to each other. As is well known in the art, P and N regions can be formed by diffusing dopants of suitable type, the principal dopants for P regions being of the opposite carrier polarity to those of the N regions. An $N^+$ or $P^+$ region is highly doped and an $N^-$ or $P^-$ region is lightly doped.

It is noted that an integrated circuit chip formed in accordance with FIG. 1 permits the same forming processes utilized to form the C-MOS channel diffusion layers, such as $P^-$-layer 6, to be utilized to form the emitter-collector of the PNP bipolar transistor. Similarly, the diffusion layers 9, 10, 13 and 14 are formed during the same step to thereby form the respective source and drains of the N-channel and P-channel transistors, the emitter and collector of the NPN transistor and the contact layer for the base. Accordingly, the instant invention is particularly characterized by forming at least one part of the electrode of the bipolar transistor and at least one C-MOS transistor in the same integrated circuit chip substrate by forming the respective diffusion layers during the same process forming stages utilized to form an integrated circuit chip.

Figure 2:
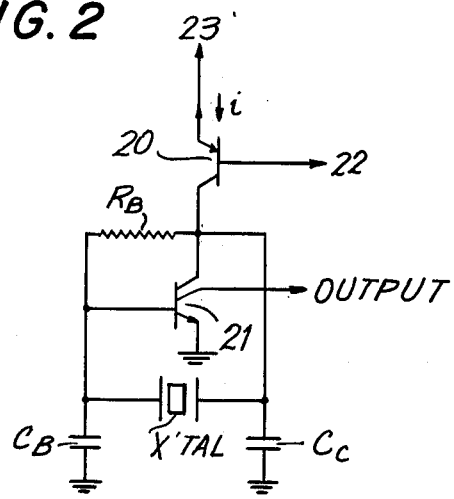
FIGS. 2 through 4 are detailed circuit diagrams, respectively, of quartz crystal oscillator circuits constructed in accordance with the instant invention.

Reference is now made to FIG. 2 wherein a first example of an oscillator circuit constructed in accordance with the instant invention is depicted. A quartz crystal vibrator X'TAL is disposed between the input and output of an inverter circuit defined by N—P—N transistor 21, P—N—P transistor 20 forming a load. Resistor $R_B$ is a bias resistor utilized to maintain an operating point at the base electrode of the N—P—N transistor. Capacitors $C_B$ and $C_C$ are utilized to compensate for phase changes and thereby further maintain the oscillatory stability of the circuit. If capacitors $C_B$ and $C_C$ are variable capacitors, they can be utilized to adjust the frequency of the circuit.

In order to stabilize the operating point of the transistor 21, the base electrode 22 of transistor 20 can be coupled so as to compensate for changes in voltage and temperature to thereby provide a fixed current i to the collector emitter path of transistor 21. Accordingly, the emitter electrode 23 of transistor 20 is connected to a constant voltage source or to the electronic timepiece power source. The difficulties in obtaining stable oscillation caused by the small input impedance of the base input of the transistor 21 can be overcome by inserting one stage of a P—N—P transistor emitter-follower in the path of the feedback input from the vibrator.

Figure 3:
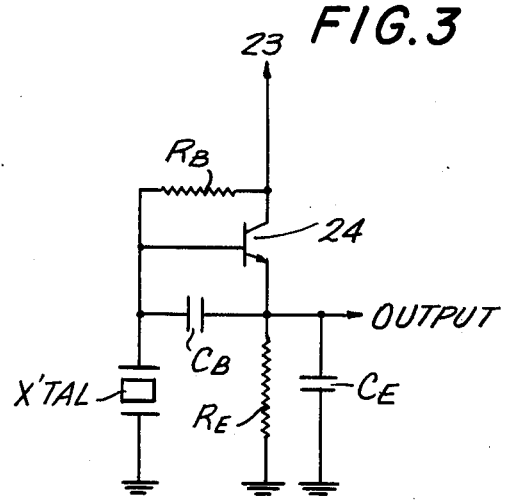

Reference is now made to FIG. 3, wherein a quartz crystal oscillator including an emitter-follower N—P—N transistor arrangement is illustrated. The oscillator circuit includes a N—P—N transistor 24 and is characterized by providing highly stable operation by coupling a first terminal of the quartz crystal vibrator X'TAL to ground. By such an arrangement, the capacitor $C_E$ can be eliminated. Moreover, the load resistor $R_E$ can be replaced with a transistor similar to the transistor 20 illustrated in FIG. 2 to thereby effect an extremely stable oscillation of the circuit. Moreover, when stable oscillation is not being successfully obtained by use of single emitter-follower stage, the quartz crystal vibrator X'TAL can be coupled through two amplifying stages to provide further feedback to the transistor 24.

Figure 4:
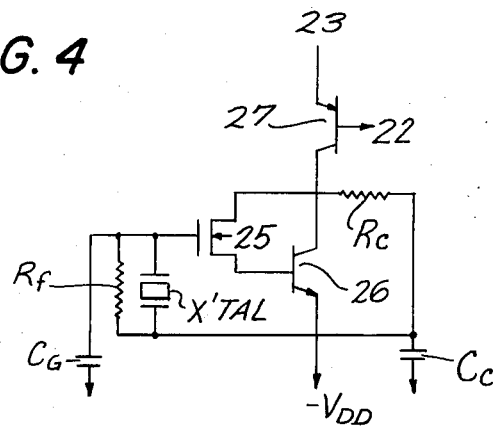

Reference is now made to FIG. 4, wherein an oscillator circuit utilizing a P-channel MOS transistor 25 for providing an input impedance is depicted.

Specifically, a MOS transistor 25 is coupled to a bipolar transistor 26, and the collector electrode of transistor 26 is coupled to a load transistor 27, like reference being utilized to denote like elements depicted above in FIGS. 2 and 3. The N-channel transistor 25 provides a high input impedance and a stable output impedance and furthermore provides a high gain to the circuit by providing a circuit having increased stability when compared to a C-MOS inverter circuit. The resistor $R_C$ and the capacitor $C_C$ are feedback elements for stabilizing the output phase of the circuit and the resistor $R_F$ is a feedback resistor for defining an operating point for the transistor 25.

Accordingly, the oscillator circuits noted above, which oscillator circuits are constructed in accordance with the instant invention, have output impedances considerably lower than conventional C-MOS oscillator circuits of the prior art. Accordingly, the oscillator circuits depicted in FIGS. 2 through 4 provide highly stable operation and prevent frequency shifts in response to external changes in the supply voltage applied thereto. It is noted that in C-MOS inverter circuits, the threshold values, the consumption currents utilized thereby, and the oscillating frequencies are widely varied. However, since the operating conditions of a bipolar transistor are determined solely by the P-N junction, the above deficiencies in the C-MOS inverter are avoided, and additionally, the power consumption of the oscillator circuit is significantly decreased.

The source of current in the oscillator circuits illustrated in FIGS. 2 through 4 is a P—N—P lateral type bipolar transistor, which transistor can be replaced by a P-channel MOS transistor, when the above-noted operating conditions are not needed. Also, the N—P—N transistor is a normal double diffusion type transistor or a reverse type transistor wherein the emitter-collector is reversed. It is further noted that the capacitors utilized in the oscillator circuits can be obtained in an integrated circuit chip by utilizing the gate capacitance of an MOS transistor. Furthermore, the resistances obtained by the resistors in the above-noted oscillator circuits can be obtained in an integrated circuit chip by the use of diffusion layers on the side of the relatively low resistance of the circuit, and, on the side of the high resistance of the circuit. The MOS transistor channel resistance can be utilized.

As noted above, most electronic wristwatches utilize flexural mode quartz crystal vibrators as a time standard, which vibrators vibrate at frequencies on the order of 32 KHz. However, vibrators have recently been developed that are capable of providing longitudinal vibration frequencies in the range of 500 KHz and thickness-shear mode quartz crystal vibrators have been developed that vibrate in the MHz range. It is noted that the quartz crystal oscillator circuits described above provide highly stabilized operation when such high frequency quartz crystal vibrators are utilized therewith.

The two types of circuits for electronic wristwatches that are representative of the type requiring considerable amounts of electric power to drive same are light emitting (LED) diode displays and mechanically driven hand displays. In LED displays, conventional MOS transistors are sufficiently large in size as to prevent the driving portion from being formed on the same circuit chip as the remaining timekeeping circuitry. Similarly, in a mechanical hands display, the driving portion occupies from one-third to one-half the area of the entire integrated circuit chip. Nevertheless, if the size of the electronic timepiece is to be reduced, it is preferred to incorporate the elements forming the driving circuit in the same integrated circuit chip as the remaining circuitry of the electronic timepiece, thereby reducing the number of chips required in the electronic wristwatch to one. In accordance with the instant invention, such reduction in the number of integrated circuit chips, and further in the chip size is effected by replacing the C-MOS transistors in the driving circuit with bipolar transistors.

Figure 5:
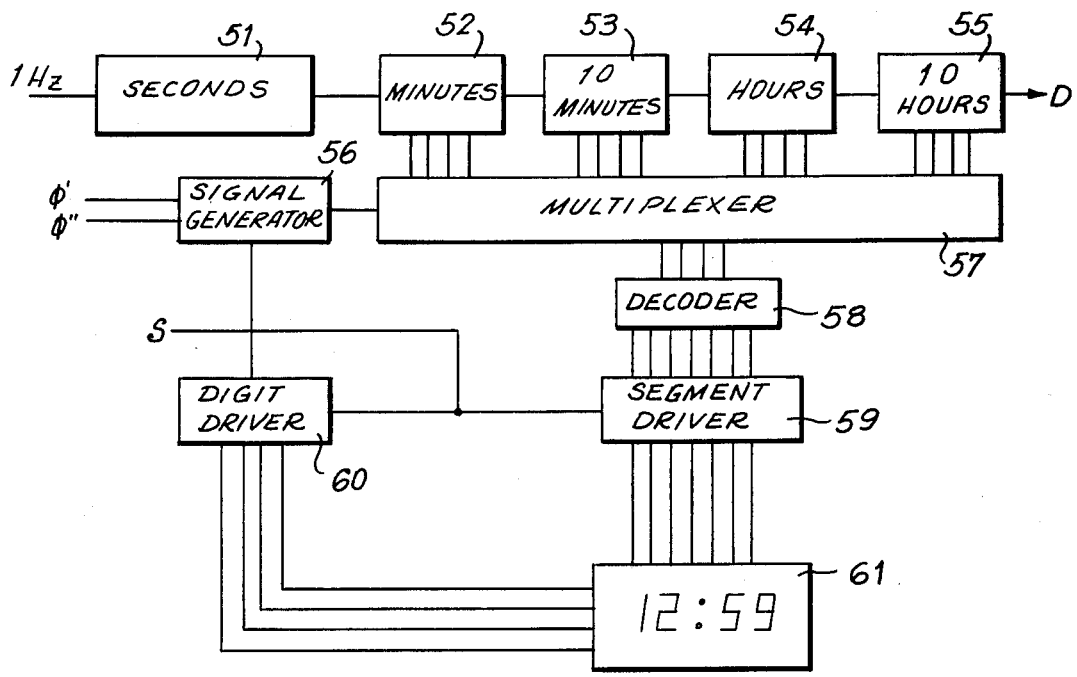
FIG. 5 is a block circuit diagram of digital display light emitting diode electronic timepiece driving circuit constructed in accordance with the prior art.

Reference is now made to FIG. 5, wherein a light emitting diode dynamic driving circuit is depicted. Each of the counters 51 through 55 are coupled in series and in response to the 1Hz signal applied to seconds counter 51 respectively produce minute digit signals, 10-minute digit signals, hours digit signals and 10-hour digit signals. A multiplexer 57 is adapted to receive the respective digit signals and combine same and apply same through decoder 58 to the segment driver 59. Additionally, the multiplexer 57 applies signals to the signal generator 56, which signals are synchronized by intermediate frequency signals $\phi'$ and $\phi''$ and thereafter applied to digit driver 60 to effect actuation of the respective digit of time to which the segment driver 59 is to apply signals.

The display digits 61 are formed of seven-segmented electrodes formed in a conventional seven-bar display. Finally, a lighting signal S is applied to the digit driver 60 and segment driver 59 to effect lighting of the light emitting diodes.

Figure 6:
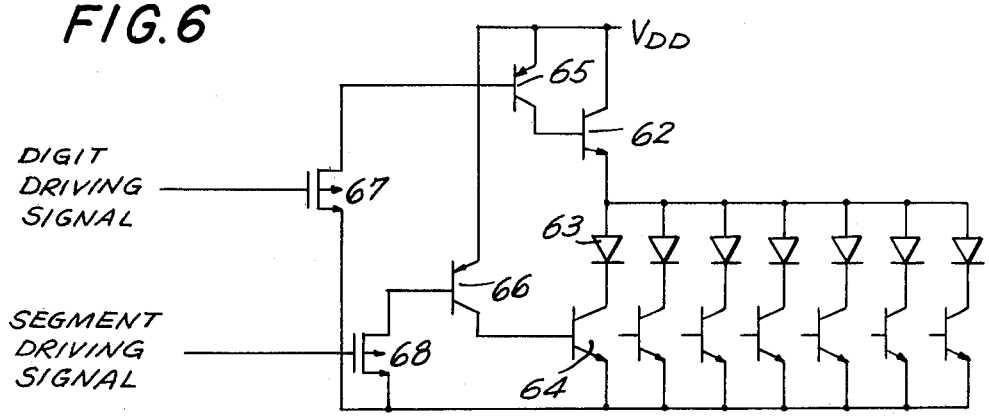
FIG. 6 is a detailed circuit diagram of a light emitting diode display driving circuit constructed in accordance with the instant invention.

Referring specifically to FIG. 6, a detailed illustration of a light emitting diode driving circuit is depicted. The segment driving transistor 62, light emitting diode 63 and segment driving transistor 64 are disposed in series between a reference potential and a potential $V_{DD}$ for energizing the respective light emitting diodes. When a seven-segmented display digit is utilized, seven light emitting diodes and seven segment driver circuits are connected on the side of the collector of one digit driver. It is noted that N—P—N transistors provide an electric current of several 10 mA. Accordingly, if $\beta$ (gain) of the transistor is to be increased, the original underside collector is used when a transistor of the reverse type is used in the logic circuit and the $\beta$ thereof is small.

Accordingly, the bases of the N—P—N transistors 62 and 64 also form the collectors of the P—N—P transistors 65 and 66 respectively. Moreover, the N-channel material of MOS transistors 67 and 68 is used to form the bases of the P—N—P transistors 65 and 66. Moreover, the gates of transistors 67 and 68 have applied thereto the digit driving signal and segment driving signal respectively.

If desired, elements 55 through 58 can be replaced with N—P—N transistors and a MOS transistor can be substituted for the P—N—P transistor 66. When the $\beta$s (gains) of transistors 62 and 64 are of sufficient magnitude, it then becomes possible to directly drive the light emitting diodes by the C-MOS elements.

Figure 7:
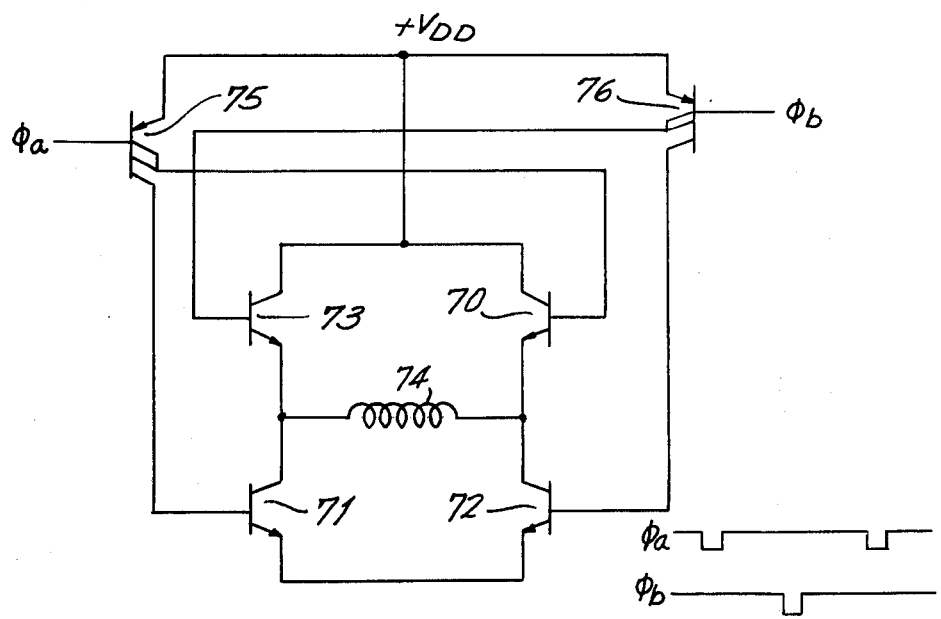
FIG. 7 is a detailed circuit diagram of an electronic wristwatch mechanical display driving circuit constructed in accordance with the instant invention.

Reference is now made to FIG. 7, wherein a bridge circuit for driving a hand display step motor drive coil 74 is depicted. N—P—N transistors 70 through 73 are formed with an underlying diffusion layer in order to increase the $\beta$ (gain). Since the effective resistance of the coil 74 of the step motor is on the order of 2—3 K. ohms, and the driving current applied thereto is on the order of several hundred $\mu$A, the bases of the respective transistors 70 through 73 can be directly driven by currents produced from the C-MOS transistors. As illustrated by the drive wave forms $\phi_A$ and $\phi_B$, by applying the driving wave forms to the respective base electrodes of MOS transistors 75 & 76, current in the form of a predetermined polarity pulse width is applied to the coil 74 every other second, thereby effecting an alternating pulse in the coil 74 each second. It is noted that transistors 75 and 76 can be replaced by MOS transistors.

It is noted that each of the circuits illustrated above is particularly suitable for use in an electronic wristwatch. A further circuit needed in electronic wristwatches is for providing a display of the battery life. When the capacity of the battery is substantially reduced thereby suggesting that the end of the battery life is imminent, unless the timepiece owner has some method of obtaining such information, he is unable to change the battery prior to the failure of same. Accordingly, battery potential monitoring circuits have been provided in electronic timepieces for providing an indication of the impending failure of the battery. For example, in hand display electronic timepieces, the second hand is stepped once every two seconds instead of once every second in order to provide an indication of the impending failure of the battery. Similarly, in digital display electronic timepieces, one of the display digits is flickered when the impending failure of the battery is detected.

Figure 8:
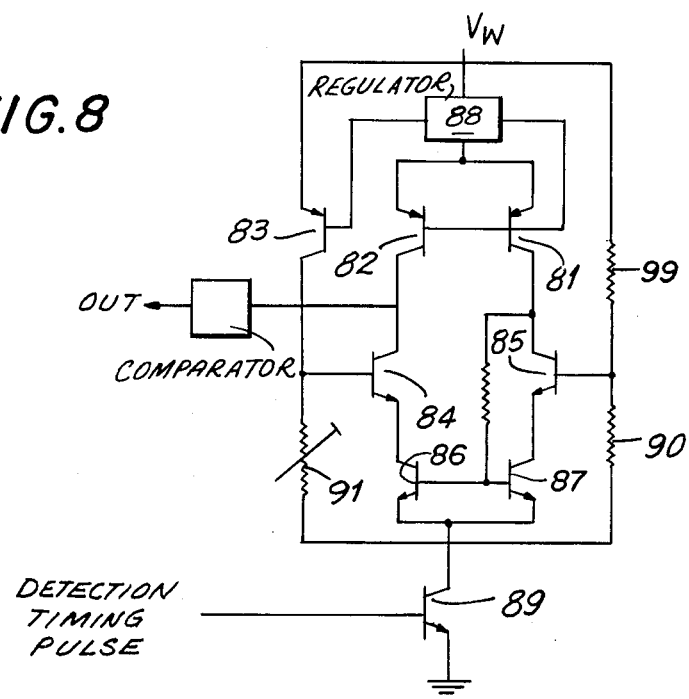
FIGS. 8 and 9 are detailed circuit diagrams of battery voltage monitoring circuits constructed in accordance with the instant invention.

Referring to FIG. 8, a circuit particularly suited for detecting the impending failure of a battery in an electronic wristwatch is depicted. P—N—P lateral transistors 81 through 83 have the bases thereof coupled to regulator circuit 88 to thereby maintain the operation of the transistors 81 through 83 independent of changes in the voltage and temperature. Transistors 84 and 85 define a differential amplifier and are respectively coupled through transistors 86 and 87 to the collector of transistor 89 so that the differential amplifier is further controlled by detecting transistor 89. The input of transistor 85 is the potential divided by the resistors 99 and 90 and corresponds to the supply voltage. Also, the input of the transistor 84 is a potential determined by the source of electric current, i.e. transistor 83, and by the current as varied by variable resistor 91. Finally, the reference voltage is determined by the regulator circuit 88. The resistor 91 is regulated so that the level of the comparator may be reversed by the voltage at which it is desired to display the battery life. Accordingly, the detection transistor 89 has the detection timing pulse applied to the base electrode thereof and is only operated at that time.

It is noted that battery voltage monitoring circuits utilizing C-MOS circuits have the following disadvantages. First, the threshold value of the MOS transistors is high. The offset regulation is often troublesome, thereby rendering the detection accuracy less than completely satisfactory. Finally, the threshold value is likely to have changed through aging. Thus, where possible, it is preferred to avoid use of such C-MOS transistors in linear circuits. Accordingly, the battery monitoring circuit illustrated in FIG. 8 provides more stable operation than a similar circuit utilizing C-MOS transistors.

Figure 9:
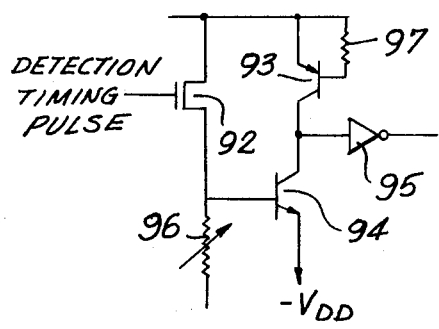

Reference is now made to FIG. 9, wherein a further detection circuit is depicted. A P-channel MOS transistor 92 and a bipolar transistor 93 are operated as the source of electric current. The drain current in the MOS transistor 92 is amplified by transistor 94 and the output potential is detected by the C-MOS inverter circuit 95. When the transistor 94 is provided with a sufficiently high gain, a stable output potential is provided even if the reverse potential of the C-MOS inverter is varied. A variable resistor 96 provides for fine adjustment of the detecting circuit. Bipolar transistors 93 and 94 have the same temperature coefficients and thereby provide stable operation in response to temperature changes.

Figure 10:
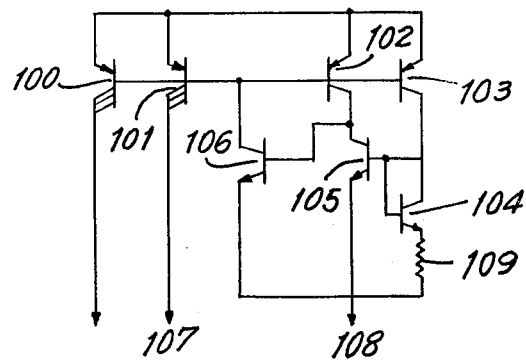
FIG. 10 is a circuit diagram of a current supply circuit constructed in accordance with the instant invention.

It is noted that the oscillator circuit, battery voltage detecting circuits and display driving circuits discussed above each require a current limiting circuit, or at least a current limiter or voltage regulating circuit for providing stable operation to the circuitry when changes in the supply voltage produced by the battery occur. Reference is made to FIG. 10, wherein such a regulator circuit is depicted. An increase or decrease in the electric current is detected by N-P-N transistor 105. The base current of the P-N-P lateral transistors 100, 101, 102 and 103 is determined by amplification transistor 106 coupled thereto. A negative feedback is applied to the base from the collector of transistor 103 by the amplified error so that the collector outputs of transistors 100, 101 are rendered stable. The transistor 104 and resistor 109 may not be necessary for stabilizing the operating point of the transistor 105. The transistors 100 through 103 could be replaced with P-channel MOS transistors. Accordingly, outputs 107 and 108 are coupled to the respective loads for effecting regulation thereof.

It is noted that a limiter-regulator circuit of the type illustrated in FIG. 10 provides the following features. The variation in operation of each element is minimized due to the use of bipolar transistors. Additionally, high stability is provided and it is unnecessary to regulate the circuit during assembly. Moreover, since the threshold values of the circuit are lower than most MOS transistors, the electric current applied to transistors 105 and 106 representative of the detected error can be utilized as a stabilizing output. Accordingly, no electric current is wasted by such a regulating-limiter circuit.

It is further noted that bipolar transistors can be utilized in circuitry requiring high switching speeds. For example, reference is made to FIGS. 11a and 11b wherein a logic element constructed in accordance with the instant invention is depicted. A P-N-P lateral transistor has an emitter 110, a base 114 and a collector 111 used as the load of the conventional transistor. Moreover, in a reverse type N-P-N transistor, diffusion area 111, is a base, and N+ areas 112 and 113 are collectors. As noted above, reverse type transistors mean that the emitter and collectors are exchanged for each other. FIG. 12 illustrates the equivalent circuit for the lateral transistor construction illustrated in FIGS. 11a and 11b. It is noted that the same diffusion layer is used for the P-N-P transistor base N−, and the emitter N− of the N-P-N transistor, and additionally that the collector P of the P-N-P transistor is the base P of the N-P-N transistor.

Finally, reference is made to FIG. 13, wherein a lateral bipolar transistor is illustrated as functioning as an NAND circuit. Specifically, inputs A and B of the NAND circuit are collector outputs of the N-P-N transistor. Accordingly, only when the outputs A, B are in the off state is current $I_f$ from current source 131 applied to the base of the N-P-N transistor 132 to thereby turn same on, and place the collector electrode at a potential proximate to the potential of the emitter electrode E. When either of the transistor inputs A, B is set ON, the current $I_f$ of the current source 132 is applied to the transistor so that the transistor 132 is turned OFF, thereby effecting an NAND circuit operation.

From the foregoing, it is clear that the following benefits inure to an electronic timepiece utilizing the instant invention. First, by increasing the type of elements capable of being integrated into a single circuit chip substrate, the number of circuits that can be integrated into a single integrated circuit chip is suitably increased over the number of circuits utilizing C-MOS elements that could be integrated into the same circuit chip. Secondly, the supply voltage applied to the emitter of the lateral P-N-P transistor and to the emitter of the N-P-N transistor thereby rendering the total forward voltage including the base, emitter and diode of the N-P-N transistor is on the order of +0.1 or 0.2 V so that even during high frequency operation, only voltages on the order of 0.6 V are needed to drive such circuitry.

Thirdly, when lateral transistors of the type disclosed herein are integrated into the same circuit chip as the C-MOS transistors, even if operating frequencies are high, the power consumption is reduced. Moreover, even if weak carrier accumulation is effected by the N-P-N transistor, the operating speeds are increased since the charging and discharging effected by the electric current source in the P-N-P lateral transistor and the parasitic capacitance itself in the P region is small, as noted above, and furthermore, the amplitude of the voltage in the P region which forms the base of the N-P-N transistor can be short, thereby reducing the electric power required.

Accordingly, when C-MOS transistors are utilized, if the high frequency time standard signal is of a high order of magnitude, or the power consumption is too large, the circuitry becomes difficult if not impossible to operate. Nevertheless, by utilizing lateral bipolar transistors to form the logic elements and forming same in the same substrates as C-MOS elements, improved operation and reduced size of the electronic timepiece is provided. Moreover, the forming of the bipolar transistors and C-MOS transistors in the same integrated circuit chip is not only applicable to linear circuit such as the oscillator circuit, battery detecting circuit and display driving circuit, but additionally, as illustrated in FIG. 13, it is equally applicable to logic circuits, other linear circuits, supply voltage circuits and the like.

It will thus be seen that the objects set forth above, among those made apparent from the preceding description, are efficiently attained and, since certain changes may be made in the above construction without departing from the spirit and scope of the invention, it is intended that all matter contained in the above description or shown in the accompanying drawings shall be interpreted as illustrative and not in a limiting sense.

It is also to be understood that the following claims are intended to cover all of the generic and specific features of the invention herein described, and all statements of the scope of the invention, which, as a matter of language, might be said to fall therebetween.

What is claimed is:

1. An electronic timepiece comprising timekeeping circuitry for producing timekeeping signals and display means for displaying time in response to said timekeeping signal, and an integrated circuit chip substrate, at least a portion of said timekeeping circuitry being formed of C-MOS transistors formed on said circuit chip substrate, a further portion of said timekeeping circuitry being formed of bipolar transistors formed on said integrated circuit chip substrate and a layer of semiconductor material formed on said circuit chip substrate, said layer of semiconductor material forming at least one electrode of one of said bipolar transistors and further having a diffused region therein forming at least one C-MOS transistor.

2. An electronic timepiece as claimed in claim 1, wherein said layer of semiconductor material includes at least one isolating region therein, said isolating region defining a first region in said layer of semiconductor material for said bipolar transistor and a second region in said layer of semiconductor material for said C-MOS transistor.

3. An electronic timepiece as claimed in claim 2, wherein said layer of semiconductor material in said first and second regions is a doped region of a first carrier polarity.

4. An electronic timepiece as claimed in claim 3, wherein a first bipolar transistor includes two first doped regions of a carrier polarity opposite to said first carrier polarity, said first doped regions being diffused in said first region of said layer of semiconductor material.

5. An electronic timepiece as claimed in claim 4, wherein a further bipolar transistor includes a second doped region of a first carrier polarity diffused in each said first doped region.

6. An electronic timepiece as claimed in claim 5, wherein third highly doped regions of said opposite carrier polarity are diffused in said first doped region and in said first region of said layer of semiconductor material for defining contacts for said bipolar transistors.

7. An electronic timepiece as claimed in claim 3, wherein a first bipolar transistor includes a first doped region of a carrier polarity opposite to said first carrier polarity, said first doped region being diffused into said first region of said layer of semiconductor material, and a second doped region of said first carrier polarity, said second doped region being diffused in said first doped region.

8. An electronic timepiece as claimed in claim 7, wherein a further bipolar transistor includes a further first doped region diffused in said first region of said layer of semiconductor material.

9. An electronic timepiece as claimed in claim 8, wherein third highly doped regions of said opposite carrier polarity are diffused in said first doped regions and in said first region of said layer of semiconductor material for defining contacts for said bipolar transistors.

10. An electronic timepiece as claimed in claim 7, and including at least two second doped regions diffused in said first doped region.

11. An electronic timepiece as claimed in claim 3, wherein each said C-MOS transistor includes at least three doped regions of a carrier polarity opposite to said first carrier polarity, said three doped regions being diffused in said second region of said layer of semiconductor material, and two second doped regions of said first carrier polarity, said second doped regions being diffused in one of said first doped regions.

12. An electronic timepiece as claimed in claim 1, wherein said timekeeping circuit includes oscillator circuit means, said oscillator circuit means including first and second bipolar transistors having a base, collector and emitter, the collector of said first bipolar transistor defining an output terminal and being coupled to one of the collector and emitter of said second bipolar transistor, and a quartz crystal vibrator coupled across the base and collector of said first bipolar transistor.

13. An electronic timepiece as claimed in claim 1, wherein said timekeeping circuitry includes oscillator means, and oscillator means including a bipolar transistor having a base, collector and emitter, a quartz crystal vibrator, said quartz crystal vibrator being coupled across a reference terminal and said base of said bipolar transistor, and an impedance means coupled in series with said collector and emitter for stabilizing the operating point of said bipolar transistor.

14. An electronic timepiece as claimed in claim 1, wherein said display means includes means for producing digit driving signals and segment driving signals, a plurality of display digits, each said display digit including a plurality of light emitting diode display segments, a first segment driving bipolar transistor and a plurality of second segment driving bipolar transistors, each said bipolar transistor having a base, emitter and collector, each said light emitting diode being series connected with the collector and emitter of said first bipolar transistor and series connected with the emitter and collector of one of said second segment driving bipolar transistors, first transistor means coupled to the base of said first bipolar transistor means, said first transistor means being adapted to render the emitter and collector of the first bipolar transistor conductive in response to a digit driving signal being applied thereto, and a plurality of second transistor means, each said second transistor means being coupled to the base of a second bipolar transistor, each said second transistor means being adapted to render conductive the collector and emitter of the second bipolar transistor in response to a segment driving signal being applied thereto.

15. An electronic timepiece as claimed in claim 14, wherein each said first and second transistor means includes an MOS transistor, said MOS transistor including a gate electrode for receiving said respective digit driving signal or segment driving signal, and a further bipolar transistor for coupling the MOS transistor to the respective base electrode of the bipolar transistor rendered conductive thereby.

16. An electronic timepiece as claimed in claim 1, wherein said display means includes a step motor coil driving circuit, said step motor coil driving circuit including six bipolar transistors having a base, collector and emitter, the collectors of said first and third bipolar transistors being coupled to the emitters of said second fourth transistors and further coupled to the respective terminals of said step motor coil, said collector of said fifth bipolar transistor being coupled to the base of said first and fourth transistors to render the collector and emitters of said first and fourth transistors conductive in response to the base of said first bipolar transistor having a drive signal applied thereto, and said collector of said sixth bipolar transistor being coupled to the base of said second and third transistors to render the collectors and emitters of said second and third bipolar transistors conductive in response to the base of said sixth bipolar transistor having a drive signal applied thereto.

17. An electronic timepiece as claimed in claim 16, and including a battery monitoring circuit coupled to said timekeeping circuitry, said battery monitoring circuit including a first polarity of bipolar lateral transistors, regulator means coupled to said first plurality of bipolar lateral transistors for rendering same independent of changes in voltage and temperature, and differential amplifier means coupled to said first plurality of bipolar transistors, said differential amplifier means being formed of at least a first bipolar transistor and voltage divider means defining an input for the supply voltage to be monitored, and a second transistor means and current divider coupled thereto for producing an output representative of the supply voltage detected, and a comparator coupled to said second transistor means for defining an output terminal.

18. An electronic timepiece as claimed in claim 17, wherein said first and second differential amplifier transistor means are coupled to a bipolar transistor, said bipolar transistor being adapted to receive a detection timing pulse and in response thereto permit said differential amplifier to effect a measurement of the supply voltage applied thereto.

19. An electronic timepiece as claimed in claim 1, wherein said timekeeping circuitry includes a current supply circuit, said current supply circuit including a plurality of bipolar lateral transistors having a base, collector and emitter, the emitter of each of said plurality of bipolar transistors being coupled together, a detecting transistor means coupled to the base of each of said plurality of first transistors for detecting the potential, for applying feedback to the commonly coupled collectors of said first plurality of transistors to stabilize the operating point of same, and for permitting the detecting transistor and at least one of the plurality of transistors to be coupled to a load to effect regulation thereof.

20. An electronic timepiece comprising timekeeping circuitry for producing timekeeping signals and display means for displaying time in response to said timekeeping signal, said timekeeping circuitry including oscillator means, said oscillator means including first and second bipolar transistors having a base, a collector and emitter, an MOS input transistor including a gate, source and drain, said source and drain being coupled to said base of said first bipolar transistor, said collector and emitter of said second bipolar transistor being series connected with the collector and emitter of said first bipolar transistor to define and impedance load therefor, a quartz crystal vibrator coupled to the gate of said MOS transistor and to the collector of said first bipolar transistor and an integrated circuit chip substrate, said MOS transistor being formed on said circuit chip substrate, said bipolar transistor being formed on said circuit chip substrate.

21. An electronic timepiece comprising timekeeping circuitry for producing timekeeping signals and display means for displaying time in response to said timekeeping signals, and an integrated circuit chip substrate, at least a portion of said timekeeping circuitry being formed of C-MOS transistors formed on said circuit chip substrate, a further portion of said timekeeping circuitry being formed of bipolar transistors formed on said integrated circuit chip substrate, a battery monitoring circuit coupled to said timekeeping circuitry, said battery monitoring circuit including first and second bipolar transistors including a base, collector and emitter, the collectors of said first and second bipolar transistors being coupled together, a C-MOS inverter coupled to the collectors of said first and second bipolar transistors, and an MOS transistor coupled to the base of said first bipolar transistor for effecting measurement of a supply voltage in response to a detection timing pulse being applied thereto.

* * * * *